US010186312B1

(12) United States Patent
Sankar et al.

(10) Patent No.: US 10,186,312 B1
(45) Date of Patent: Jan. 22, 2019

(54) HYBRID STACK WRITE DRIVER

(71) Applicant: GLOBALFOUNDRIES INC., Grand Cayman (KY)

(72) Inventors: Arjun Sankar, Karnataka State (IN); Venkatraghavan Bringivijayaraghavan, Tamilnadu State (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/730,850

(22) Filed: Oct. 12, 2017

(51) Int. Cl.
| | | |
|---|---|---|
| *G11C 7/22* | (2006.01) | |
| *G11C 11/4094* | (2006.01) | |
| *G11C 11/403* | (2006.01) | |
| *G11C 11/4096* | (2006.01) | |
| *G11C 11/4097* | (2006.01) | |

(52) U.S. Cl.
CPC ........ *G11C 11/4094* (2013.01); *G11C 11/403* (2013.01); *G11C 11/4096* (2013.01); *G11C 11/4097* (2013.01)

(58) Field of Classification Search
CPC ....... G11C 11/419; G11C 7/12; G11C 11/412; G11C 7/1096; G11C 5/145; G11C 11/413; G11C 5/14; G11C 5/147; G11C 7/14
USPC ......... 365/154, 189.16, 156, 189.11, 189.09, 365/203, 189.02, 190, 194, 204, 228, 365/230.03
See application file for complete search history.

(56) References Cited

U.S. PATENT DOCUMENTS

| | | | |
|---|---|---|---|
| 8,363,453 B2 | 1/2013 | Arsovski et al. | |
| 8,427,896 B1 | 4/2013 | Agarwal et al. | |
| 8,593,890 B2 | 11/2013 | Adams et al. | |
| 9,355,710 B2 | 5/2016 | Gong et al. | |
| 9,508,420 B1 | 11/2016 | Hunt-Schroeder et al. | |
| 9,548,104 B1 | 1/2017 | Braceras et al. | |
| 2007/0081379 A1 | 4/2007 | Clinton et al. | |
| 2009/0235171 A1* | 9/2009 | Adams ................ | G11C 7/1096 715/723 |
| 2010/0188909 A1 | 7/2010 | Kenkare et al. | |
| 2014/0112062 A1 | 4/2014 | Trivedi et al. | |
| 2014/0160871 A1 | 6/2014 | Zimmer et al. | |
| 2014/0204657 A1 | 7/2014 | Dally | |

* cited by examiner

*Primary Examiner* — Thong Q Le
(74) *Attorney, Agent, or Firm* — Gibb & Riley, LLC; Michael J. LeStrange, Esq.

(57) ABSTRACT

A circuit includes a memory array having memory cells and bitlines. A write driver is connected to the bitlines through column select transistors. A write assist circuit is connected to the write driver. The write assist circuit includes a common boost node, negative boost transistors, and a keeper transistor. The negative boost transistors are connected from the digit lines to the common boost node. The negative boost transistors selectively pull the bitlines of a selected cell of the memory array to ground during a write operation to the selected cell of the memory array. The write assist circuit may include a first negative boost transistor connected from a first digit line to the common boost node, a second negative boost transistor connected from a second digit line to the common boost node, and a keeper transistor connected from the common boost node to ground.

20 Claims, 4 Drawing Sheets

US 10,186,312 B1

HYBRID STACK WRITE DRIVER

FIELD OF THE INVENTION

The present disclosure relates to semiconductor structures, and, more specifically, to memory cells with write-assist schemes and methods of use.

Random access memory (RAM) may be static or dynamic. Static random access memory (SRAM) is a type of semiconductor memory used in many integrated circuit applications, which uses bistable latching circuitry to store each bit. SRAM is a desirable type of memory due to its high-speed, low power consumption, and simple operation. The term static differentiates it from dynamic random access memory (DRAM), which must be periodically refreshed. Unlike DRAM, SRAM does not need to be regularly refreshed to retain the stored data.

A typical SRAM cell includes a pair of cross-coupled inverters that hold a desired data bit value (i.e., either a 1 or a 0) and the complement of that value. While SRAM is a desirable type of memory, it is known that if not properly designed and fabricated, an SRAM cell can become unstable when accessed, at which point the held bit value can switch.

An SRAM cell has three different states: standby, read and write. In order for the SRAM to operate in read mode and write mode, it should have "readability" and "write stability" respectively. Readability of an SRAM cell is the ability to drive a required signal magnitude onto the bitline within a specified time allocated for signal development, and is a function of the read current of the cell. Typically, write operations limit the cycle time in a SRAM. A conventional write driver may have write assist, which has three stacks in the path for discharging the bitline (BL). The greater the number of transistors in the path of the BL to the write driver, the slower will be the pull down of the BL during write operations. With higher numbers of cells per bitline, the RC time constant associated with the bitline aggravates this issue even further. Hence, a fast and efficient write driver is required for high performance SRAM.

SUMMARY

Devices and methods herein provide a two-stack write driver that is integrated with the charge pump. In the two-stack write driver, the bitline is pulled to ground primarily by a two-stack device. For write assist, there is an alternate two-stack path. This improves the pull down time for the bitline and attains high performance.

According to a circuit herein, the circuit includes a memory array having memory cells and bitlines. A digit line is connected to the bitlines of a column through a write column-select transistor, so that only a selected bitline is accessed. A write driver is connected to the digit lines. A write assist circuit is connected to the write driver. The write assist circuit includes a common boost node and negative boost transistors. The negative boost transistors are connected from the digit lines to the common boost node. The negative boost transistors selectively pull the digit lines of a selected cell of the memory array to ground during a write operation to the selected cell of the memory array. The write assist circuit may include a first negative boost transistor connected from a first digit line to the common boost node, a second negative boost transistor connected from a second digit line to the common boost node, and a keeper transistor connected from the common boost node to ground.

According to a device herein, the device includes a memory array having memory cells and bitlines. A digit line is connected to the bitlines of a column of the memory array through a write column-select transistor, so that only a selected bitline is accessed. Each of the memory cells includes a first pair of complementary metal-oxide-semiconductor (CMOS) inverters forming a first CMOS NOR gate and a second pair of CMOS inverters forming a second CMOS NOR gate. A write driver is connected from a first digit line and a second digit line to each of the cells of the memory array. The write driver includes a first transistor connected from the first digit line to the first CMOS NOR gate output and ground and a second transistor connected from the second digit line to the second CMOS NOR gate output and ground. A write assist circuit is connected to each of the cells of the memory array. The write assist circuit includes a common boost node, a first negative boost transistor connected from the first digit line to the common boost node, a second negative boost transistor connected from the second digit line to the common boost node, and a keeper transistor connected from the common boost node to ground. The negative boost transistors and the keeper transistor selectively pull the digit lines of a selected cell of the memory array to ground during a write operation to the selected cell of the memory array.

According to a method herein, an array of memory cells is provided, the array being connected to bitlines. Each cell of the array is connected to a pair of bitlines. During write operations, a negative voltage is established on each of the selected bitlines using a write driver transistor connected to each bitline of the pair of the selected bitlines. The negative voltage on each of the selected bitlines may be selectively boosted using negative boost transistors connected from the bitlines to a common boost node.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
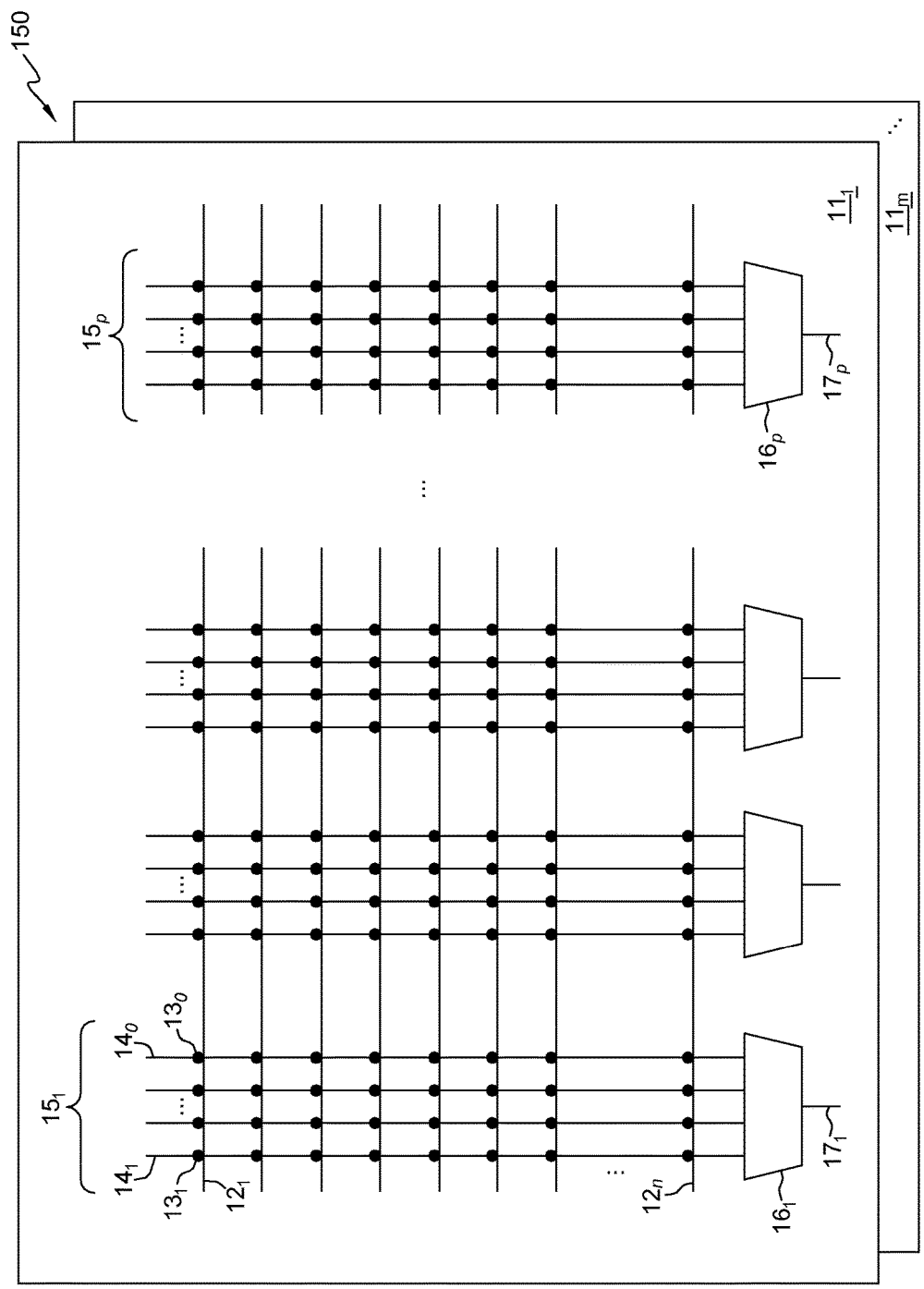
FIG. 1 is a schematic drawing illustrating an exemplary memory on an integrated circuit chip.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Referring to FIG. 1, disclosed herein are embodiments of an integrated circuit chip having an array of memories, indicated generally as 150. More particularly, each of the memories in the memory array 150 can include one or more memory banks $11_1$-$11_m$, where the number m is the total number of banks and where each bank is essentially identical. Each memory bank $11_1$-$11_m$ can include one or more word lines $12_1$-$12_n$ (corresponding to rows), where the number n is the total number of word lines per bank. Each memory bank $11_1$-$11_m$ can also include one or more data bit columns $15_1$-$15_p$, where the number p is the total number of data bit columns per bank and where the data bit columns are essentially identical. Each data bit column $15_1$-$15_p$ can traverse the word lines $12_1$-$12_n$ so as to incorporate adjacent sections of the word lines $12_1$-$12_n$. Each data bit column $15_1$-$15_p$ can further include one or more memory cells $13_1$-$13_o$ electrically connected to each of those adjacent sections of the word lines $12_1$-$12_n$ and one or more bitlines $14_1$-$14_o$ (corresponding to columns) electrically connected to the memory cells $13_1$-$13_o$, respectively, at the adjacent sections of the word lines $12_1$-$12_n$. Thus, the number o corresponds to the number of memory cells electrically connected to each adjacent section of each word line in a data bit column as well as the corresponding number of bitlines connected to the memory cells in the data bit column. This number o is referred to herein as the decode number (i.e., a decode o). Each data bit column $15_1$-$15_p$ can, in the case of multiple bitlines (i.e., multiple columns) per data bit column, further include a corresponding multiplexer $16_1$-$16_p$ that receives, as inputs, signals from the bitlines $14_1$-$14_o$ and outputs a single data bit $17_1$-$17_p$, respectively. In such a memory, the number p of data bit columns is the same as the number p of single data bits output and is referred to as the data bit width. In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bitline intersection) to be accessed (i.e., read from or written to) in each of the data bit columns. The actual total address space is equal to the number m of banks multiplied by the number n of word lines per bank multiplied by the decode number o per data bit column.

The integrated circuit chip can include any number of two or more memories. The memories can be the same type of memories and can be configured, for example, as illustrated in FIG. 1. The memories can all be dynamic random access memory (DRAM) arrays, static random access memory (SRAM) arrays, or any other specific type of memory arrays, etc. Each of these memories can further be associated with a predetermined maximum address space. For example, current state-of-the-art SRAM arrays have a maximum possible size of 16 banks, 512 word lines per bank and a decode number of 32 (i.e., a decode 32) and, thereby a maximum possible address space of 256,000 addresses.

These memories can have the exact same configuration (e.g., the same number of banks, the same number of word lines per bank and the same decode number per data bit column such that they each have the same total address space. Alternatively, any two or more of the memories can have different configurations (e.g., different numbers of banks, different numbers of word lines per bank and/or different decode numbers per data bit column) such that they have different total address spaces. For example, the memories can all include SRAM arrays; however, one memory can have 2 banks, each with 256 word lines and a decode number of 8 for a total address space of 4096 addresses; another memory can have 8 banks, each with 128 word lines and a decode number of 4 for a total address space of 4096 addresses; and yet another memory can have 4 banks, each with 16 word addresses and a decode number of 16 for a total address space of 1024 addresses. These are just examples. Any configuration of memories can be used, as would be known by one of ordinary skill in the art.

According to an embodiment, an array of static random access memory (SRAM) cells is provided, the array being connected to bitlines. Each cell of the array is connected to a pair of digit lines. During write operations, a negative voltage is established on each of the digit lines using a write driver transistor connected to each digit line of the pair of the digit lines. The negative voltage on each of the digit lines is selectively boosted using a first negative boost transistor connected from a first digit line of the pair of the digit lines to a common boost node, a second negative boost transistor connected from a second digit line of the pair of the digit lines to the common boost node, and a keeper transistor connected from the common boost node to ground.

Figure 2:
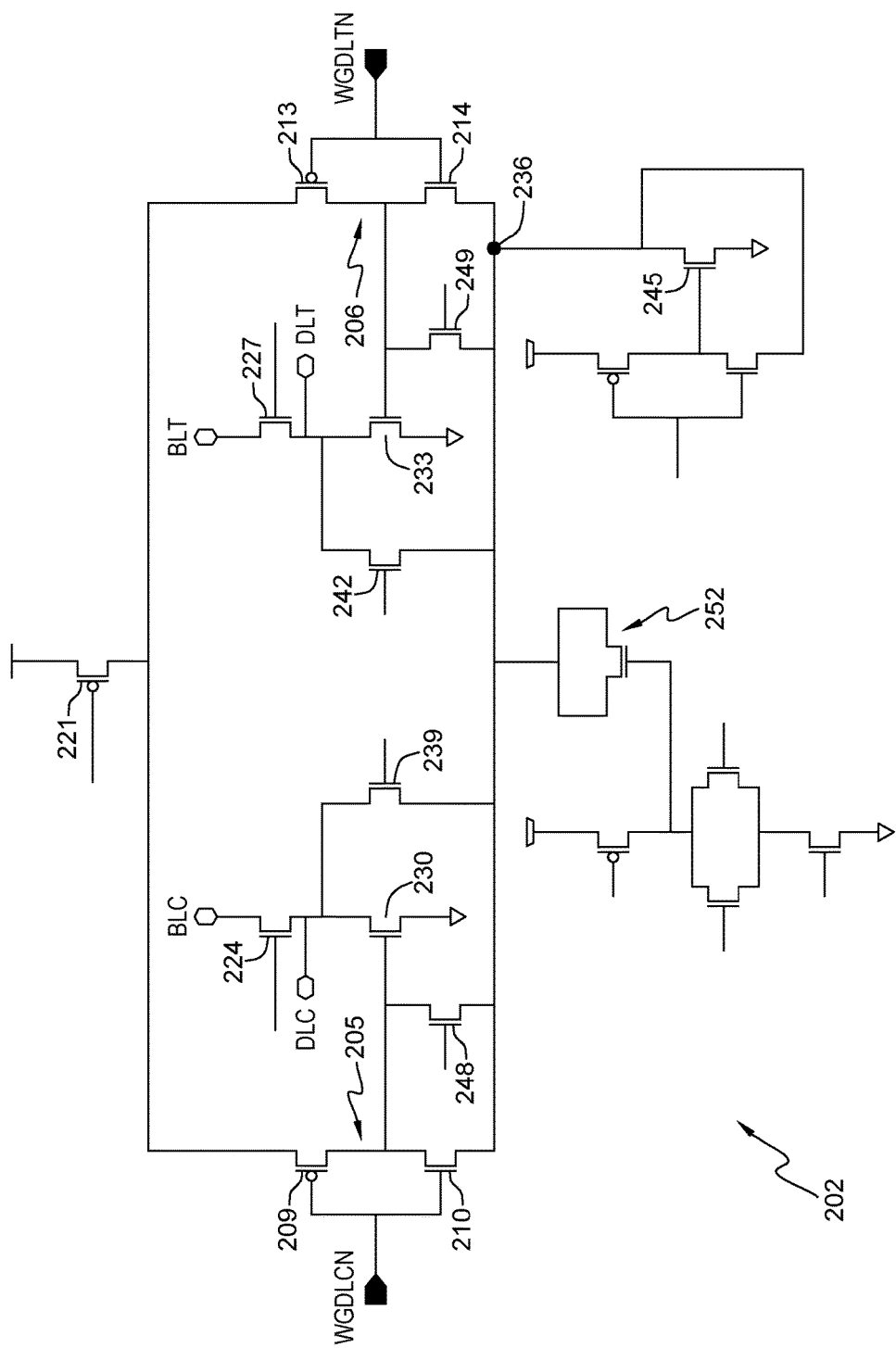
FIG. 2 is a schematic diagram of a two stack write driver according to devices and methods herein.

FIG. 2 illustrates a schematic diagram of a write driver, generally designated as 202, for an SRAM cell as may be employed in the memory array 150 of FIG. 1. The write driver circuit includes pairs of CMOS NOR gate devices 205, 206. The first CMOS NOR gate device 205 is made up of transistors 209, 210, 248 and the second CMOS NOR gate device 206 is made up of transistors 213, 214 and 249. The CMOS NOR gates shown herein share a common PMOS transistor 221, but can be different also. The CMOS NOR gate devices 205, 206 have incoming data WGDLCN/WGDLTN, respectively. The incoming data is gated with a write assist enable clock through NMOS transistors 248, 249 and the shared PMOS transistor 221. The write driver 202 also includes corresponding write column-select transistors 224 and 227, respectively, which are pass gate transistors. The write column-select transistors 224 and 227 are connected between a first bitline BLC and a second bitline BLT and the digit lines DLC and DLT respectively, associated with the CMOS NOR gate devices 205, 206. For writing operations, the write driver 202 includes a first transistor 230 connected from the first digit line DLC to the first pair of CMOS NOR gate devices 205 output and ground, and a second transistor 233 connected from the second digit line DLT to the second pair of CMOS NOR gates 206 output and ground. According to embodiments herein, a write assist circuit is connected from each of the digit lines DLC, DLT to each pair of CMOS NOR gate devices 205, 206. The write assist circuit includes a common boost node 236 with a first negative boost transistor 239 connected from the first digit line DLC to the common boost node 236, a second negative boost transistor 242 connected from the second digit line DLT to the common boost node 236, and a keeper transistor 245 connected from the common boost node 236 to ground. The write assist circuit provides an alternate pull down path for the digit lines DLC, DLT to the common boost node 236 that is held to ground through the first negative boost transistor 239, second negative boost transistor 242, and the keeper transistor 245.

In the illustrated embodiment, the boost node is always held to ground through the keeper transistor 245 prior to boosting. During write operations, one of the digit lines DLC or DLT is pulled to ground through the first transistor 230 or the second transistor 233, respectively. At the same time, there is an alternate 3-Stack pull down path through the first and second negative boost transistors 239, 242 to the common boost node 236 and the keeper transistor 245 to ground. Once one of the first digit line DLC or second digit line DLT is pulled to ground, a boost enable signal connected to the shared PMOS transistor 221, and NMOS transistors 248 and 249 is triggered. This will make the outputs from the CMOS NOR gate devices 205, 206 that are connected to the first transistor 230 or the second transistor 233 to low. Then, the keeper transistor 245 is turned off. After this, the digit lines are boosted through the first negative boost transistor 239 and the second negative boost transistor 242, respectively, by activating charge pump circuit 252.

Figure 3:
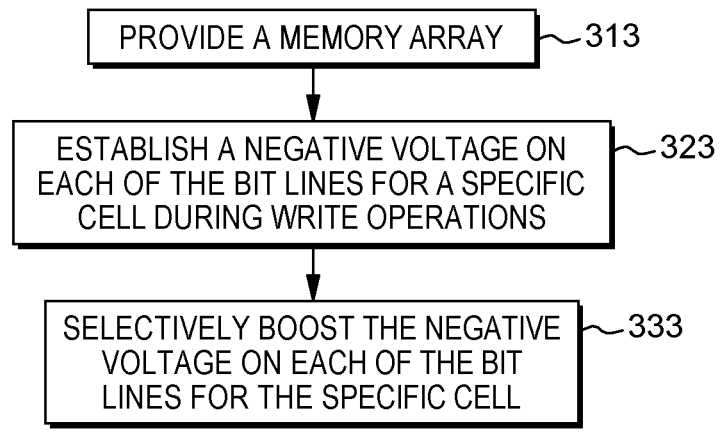
FIG. 3 is a flow diagram illustrating devices and methods herein.

FIG. 3 is a flow diagram illustrating the processing flow of an exemplary method according to devices and methods herein. At 313, an array of static random access memory (SRAM) cells is provided. The array is connected to bitlines, and each cell of the array is connected to a pair of bitlines. At 323, during write operations to a specific cell, a negative voltage is established on each of the bitlines for that cell using a write driver transistor connected to each bitline of the pair of the bitlines data paths. At 333, the negative voltage on each of the bitlines for the specific cell is selectively boosted using a first negative boost transistor connected from a first bitline of the pair of the bitlines to a common boost node, a second negative boost transistor connected from a second bitline of the pair of the bitlines to the common boost node, and a keeper transistor connected from the common boost node to ground.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to various devices and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further system and method herein, an article of manufacture is provided that includes a tangible computer readable medium having computer readable instructions embodied therein for performing the steps of the computer implemented methods, including, but not limited to, the method illustrated in FIG. 3. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 3.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the devices and methods herein by software and/or firmware, a program constituting the software may be installed into a computer with dedicated hardware, from a storage medium or a network, and the computer is capable of performing various functions if with various programs installed therein.

Figure 4:
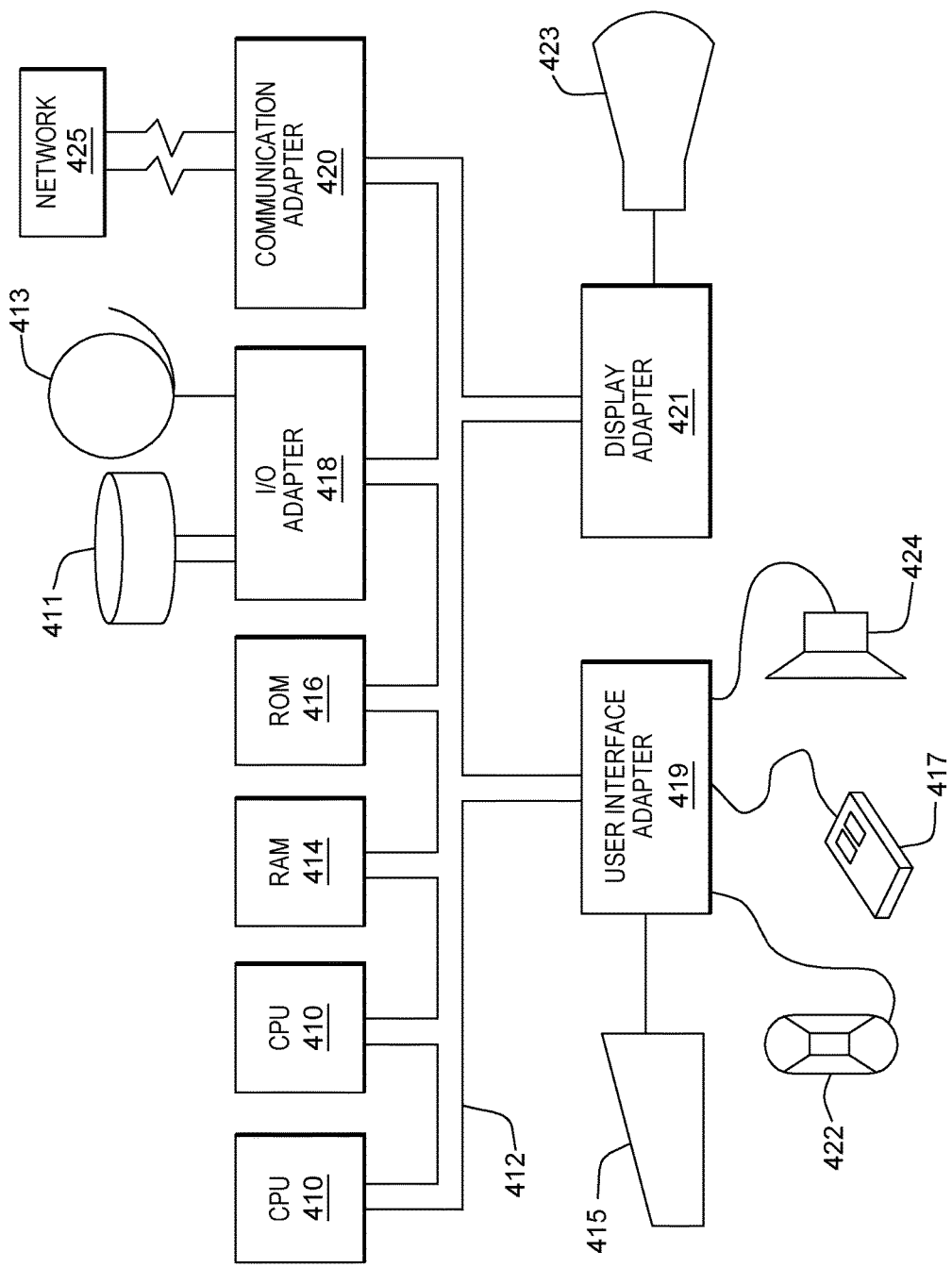
FIG. 4 is a schematic diagram of a hardware system according to devices and methods herein.

A representative hardware environment for practicing the devices and methods herein is depicted in FIG. 4. This schematic drawing illustrates a hardware configuration of an information handling/computer system in accordance with the devices and methods herein. The system includes at least one processor or central processing unit (CPU) 410. The CPUs 410 are interconnected via system bus 412 to various devices such as a Random Access Memory (RAM) 414, Read-Only Memory (ROM) 416, and an Input/Output (I/O) adapter 418. The I/O adapter 418 can connect to peripheral devices, such as disk units 411 and tape drives 413, or other program storage devices that are readable by the system. The system can read the inventive instructions on the program storage devices and follow these instructions to execute the methodology of the devices and methods herein.

In FIG. 4, CPUs 410 perform various processing based on a program stored in a Read Only Memory (ROM) 416 or a program loaded from a peripheral device, such as disk units 411 and tape drives 413 to a Random Access Memory (RAM) 414. In the RAM 414, required data when the CPUs 410 perform the various processing or the like is also stored, as necessary. The CPUs 410, the ROM 416, and the RAM 414 are connected to one another via a bus 412. An I/O adapter 418 is also connected to the bus 412 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 414, as necessary.

The system further includes a user interface adapter 419 that connects a keyboard 415, mouse 417, speaker 424, microphone 422, and/or other user interface devices such as a touch screen device (not shown) to the bus 412 to gather user input. Additionally, a communication adapter 420 including a network interface card such as a LAN card, a modem, or the like connects the bus 412 to a data processing network 425. The communication adapter 420 performs communication processing via a network such as the Internet. A display adapter 421 connects the bus 412 to a display device 423, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 4, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 416, a hard disk contained in the storage section of the disk units 411, or the like, which has the program stored therein and is distributed to the user together with the device that contains them.

As will be appreciated by one skilled in the art, aspects of the devices and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which includes one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A circuit, comprising:
   a memory array having memory cells and bitlines, the memory array being arranged in columns;
   digit lines connected to the bitlines of a column of the memory array;
   a write column-select transistor connected to the digit lines, so that only a selected bitline is accessed;
   a write driver connected to the digit lines, the write driver comprising a transistor for each digit line connecting the digit line to ground during a write operation; and
   a write assist circuit connected to the digit lines, wherein the write assist circuit is separate from the write driver and comprises a common boost node, negative boost transistors, a negative charge pump circuit providing a negative charge to said common boost node during said write operation, and a keeper transistor maintaining said common boost node at ground prior to boosting for said write operation, wherein the negative boost transistors are connected from the digit lines to the common boost node, and wherein the negative boost transistors selectively pull the digit lines of a selected cell of the memory array negative during said write operation to a selected cell of the memory array.

2. The circuit according to claim 1, the write assist circuit further comprising:
   a first negative boost transistor connected from a first digit line to the common boost node,
   a second negative boost transistor connected from a second digit line to the common boost node, and
   a keeper transistor connected from the common boost node to ground.

3. The circuit according to claim 1, the memory array comprising one of:
   SRAM;
   DRAM;
   eDRAM;
   MRAM; and
   Flash.

4. The circuit according to claim 1, wherein the write driver writes data to the memory array.

5. The circuit according to claim 1, wherein cells of the memory array comprise a first pair of complementary metal-oxide-semiconductor (CMOS) inverters forming a first CMOS NOR gate and a second pair of CMOS inverters forming a second CMOS NOR gate.

6. The circuit according to claim 5, the write driver further comprising:
   a first transistor connected from a first bitline to the first CMOS NOR gate and ground, and
   a second transistor connected from a second bitline to the second CMOS NOR gate and ground.

7. The circuit according to claim 6, further comprising:
   a pair of pass gate transistors gating incoming data to the write driver, each transistor of the pair of pass gate transistors being controlled by a complementary input data signal.

8. The circuit according to claim 7, wherein the pair of pass gate transistors include N-channel field effect transistors (NFETs).

9. A semiconductor device, comprising:
   a memory array comprising memory cells and bitlines, the memory array being arranged in columns and each of the memory cells comprising a first complementary metal-oxide-semiconductor (CMOS) NOR gate and a second CMOS NOR gate;

digit lines connected to the bitlines of a column of the memory array;

a write column-select transistor connected to the digit lines, so that only a selected bitline is accessed;

a write driver connected from a first digit line and a second digit line to each of the memory cells of the memory array, the write driver comprising:
  a first transistor connected from the first digit line to the first CMOS NOR gate output and ground, wherein the first transistor grounds the first digit line during a write operation, and
  a second transistor connected from the second digit line to the second CMOS NOR gate output and ground, wherein the second transistor grounds the second digit line during said write operation; and a write assist circuit connected to each of the cells of the memory array, the write assist circuit being separate from the write driver and comprising:
  a common boost node;
  a first negative boost transistor connected from the first digit line to the common boost node,
  a second negative boost transistor connected from the second digit line to the common boost node,
  a keeper transistor connected from the common boost node to ground, said keeper transistor maintaining said common boost node at ground prior to boosting for a write operation, and
  a negative charge pump circuit providing a negative charge to said common boost node during said write operation,
    wherein the first negative boost transistor, the second negative boost transistor, and the keeper transistor selectively pull the digit lines of a selected cell of the memory array negative during said write operation to a selected cell of the memory array.

10. The semiconductor device according to claim 9, the memory array comprising one of:
  SRAM;
  DRAM;
  eDRAM;
  MRAM; and
  Flash.

11. The semiconductor device according to claim 9, wherein the write driver writes data to the memory array.

12. The semiconductor device according to claim 9, further comprising:
  a pair of pass gate transistors gating incoming data to the write driver, each transistor of the pair of pass gate transistors being controlled by a complementary input data signal.

13. The semiconductor device according to claim 12, wherein the pair of pass gate transistors include N-channel field effect transistors (NFETs).

14. A method of using a memory cell, comprising:
providing an array of memory cells connected to bitlines, each cell of the array of memory cells being connected to a pair of bitlines; and
during write operations,
  separately grounding each bitline of the pair of bitlines using a write driver transistor connected to each bitline of the pair of the bitlines, and
  establishing a negative voltage on each bitline of the pair of bitlines
  using negative boost transistors connected from each bitline of the pair of bitlines to a common boost node on a separate circuit.

15. The method according to claim 14, the array of memory cells comprising one of:
  SRAM;
  DRAM;
  eDRAM;
  MRAM; and
  Flash.

16. The method according to claim 14, the negative boost transistors comprising:
  a first negative boost transistor connected from a first bitline to the common boost node,
  a second negative boost transistor connected from a second bitline to the common boost node, and
  a keeper transistor connected from the common boost node to ground.

17. The method according to claim 14, wherein the writing operations comprise writing data to the array of memory cells.

18. The method according to claim 14, further comprising:
  gating incoming data from each bitline of the pair of bitlines using a pair of pass gate transistors, each transistor of the pair of pass gate transistors being controlled by a complementary input data signal.

19. The method according to claim 18, wherein the pair of pass gate transistors include N-channel field effect transistors (NFETs).

20. The method according to claim 14, wherein cells of the array of memory cells comprise a first pair of complementary metal-oxide-semiconductor (CMOS) devices forming a first CMOS NOR gate and a second pair of CMOS devices forming a second CMOS NOR gate, and the establishing a negative voltage on each bitline of the pair of bitlines further comprises:
  establishing a negative voltage using a first transistor connected from a first bitline to the first CMOS NOR gate and ground, and
  establishing a negative voltage using a second transistor connected from a second bitline to the second CMOS NOR gate and ground.

* * * * *